(12) United States Patent
Yoshioka et al.

(10) Patent No.: US 6,329,050 B1
(45) Date of Patent: Dec. 11, 2001

(54) ADHESIVE FOR ELECTRONIC PARTS AND ADHESIVE TAPE FOR ELECTRONIC PARTS

(75) Inventors: Ken Yoshioka; Hitoshi Narushima; Osamu Oka, all of Shizuoka (JP)

(73) Assignee: Tomoegawa Paper Co., Ltd., Tokyo (JP)

( * ) Notice: Subject to any disclaimer, the term of this patent is extended or adjusted under 35 U.S.C. 154(b) by 0 days.

(21) Appl. No.: 09/643,743

(22) Filed: Aug. 23, 2000

Related U.S. Application Data

(62) Division of application No. 09/373,606, filed on Aug. 13, 1999, now Pat. No. 6,187,874.

(30) Foreign Application Priority Data

Aug. 14, 1998 (JP) .................................................. 10-229199

(51) Int. Cl.$^7$ .................................................. B32B 15/04
(52) U.S. Cl. .................................. 428/355 EP; 428/355; 428/355 N
(58) Field of Search .............................. 428/355, 355 EP, 428/355 N

(56) References Cited

U.S. PATENT DOCUMENTS

| 5,252,703 | 10/1993 | Nakajima et al. . |
| 5,916,688 | 6/1999 | Tokuhisa et al. . |
| 6,117,510 | * 9/2000 | Ishikawa et al. .................... 428/41.7 |

FOREIGN PATENT DOCUMENTS

| 5-25452 | 2/1993 | (JP) . |
| 5-25453 | 2/1993 | (JP) . |
| 6-200216 | 7/1994 | (JP) . |

* cited by examiner

*Primary Examiner*—Ana Woodward
(74) *Attorney, Agent, or Firm*—McDermott, Will & Emery

(57) ABSTRACT

The invention provides an adhesive for electronic parts, which satisfies both points of heat resistance and the ability to form an adhesive layer, and of low-temperature adhesive property, and an adhesive tape for electronic parts making use of such an adhesive. The adhesive comprises, as a resin component, two polyimide resins different in glass transition temperature by at least 20° C. from each other, and an epoxy resin. At least one of the two polyimide resins is a reactive polyimide having structural units represented by the following formula (I) structural units represented by the following formula (II) and structural units represented by the following formula (III), the other is a polyimide having structural units represented by the formula (I) and structural units represented by the formula (II), and the reactive polyimide and the epoxy resin are contained in ranges of at least 25 parts by weight and 10 to 100 parts by weight, respectively, per 100 parts by weight of the whole polyimide resin,

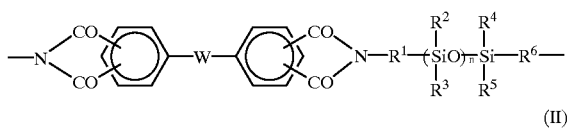

(I)

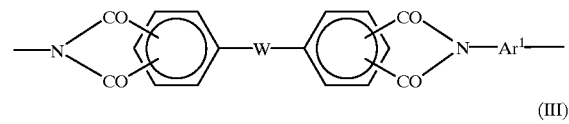

(II)

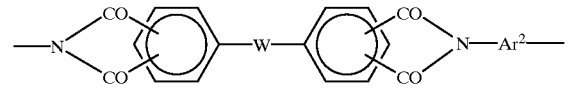

(III)

wherein W means a single bond, an alkylene group, —O—, —SO$_2$— or —CO—, Ar$^1$ denotes a divalent aromatic group such as a diphenylmethane group, and Ar$^2$ represents a divalent aromatic group having OH group(s) or COOH groups.

5 Claims, No Drawings

ADHESIVE FOR ELECTRONIC PARTS AND ADHESIVE TAPE FOR ELECTRONIC PARTS

This application is a Divisional of application Ser. No. 09/373,606 filed Aug. 13, 1999, now U.S. Pat. No. 6,187,874.

BACKGROUND OF THE INVENTION

1. Field of the Invention

The present invention relates to adhesives for electronic parts and adhesive tapes using them, which are suitable for use in production of tape carrier packages (TCP), tape BGA (ball grid arrays), CSP (chip size packages), etc. which are suitable for the inclusion of many pins, miniaturization and high density assembly in a fabrication process of semiconductor devices, and particularly are most suitable for use in bonding of semiconductor chips, radiation plates and circuit boards making good used of TAB (tape automated bonding) techniques, which are all used in these packages.

2. Description of the Related Art

In the conventional adhesive tapes for electronic parts, an adhesive layer composed of an aliphatic polyamide resin and an epoxy resin, a polyamide resin, an epoxy resin and a phenol resin, or the like is formed on at least one side of a heat-resistant film as represented by TAB tapes. As the polyamide resin in the adhesive layer, is used nylon, dimeric acid polyamide or the like.

Film carrier tapes represented by the TAB system have been recently required to make fine by narrowing their conductor width and conductor spacing. Therefore, such a conventional adhesive as described above has become insufficient in insulating property and heat resistance. In wire bonding, copper forming a circuit requires to be plated with nickel or gold. Electro-plating has heretofore been used. However, electroless plating is suitable for thin film plating attendant upon the fining. By the way, the above-described adhesives heretofore used in TAB tapes have encountered problems such as lowering of electrical reliability due to lowering of their adhesive strength by a high temperature upon electroless plating and wire bonding failure by adsorption of impurity components such as sulfur in a plating solution.

In recent years, circuit board materials of the additive type, in which a copper layer is formed directly on a polyimide film or the like, have begun to be marketed. Since perforating in the fabrication of a semiconductor device comes to depend on laser and etching, however, they have a demerit that the productivity of semiconductor devices is low. The additive type circuit board material itself also involves a problem of poor productivity, since plating forms its conductor layer.

With such circumstances in view, various kinds of polyimide adhesives have been developed to date. For example, Japanese Patent Application Laid-Open No. 25453/1993 discloses a heat-resistant resin adhesive comprising soluble polyimide siloxanes consisting of an aromatic tetracarboxylic acid component composed mainly of a biphenyltetracarboxylic acid, a diaminopolysiloxane component and an aromatic diamine component, an epoxy compound and an epoxy hardener, and Japanese Patent Application Laid-Open No. 25452/1993 discloses a heat-resistant adhesive in which a bismaleimide resin is additionally added to the above described adhesive. Furthermore, Japanese Patent Application Laid-Open No. 200216/1994 discloses an adhesive film comprising a polyimide resin having silicon units, and an epoxy resin, and describes the polyimide resin to the effect that at least 1 mol % of a divalent aromatic group having a functional group is preferably contained as a component thereof.

SUMMARY OF THE INVENTION

However, the polyimide resins containing silicon units disclosed in these publications do not satisfy both of heat resistance and formability of the layer, and of low-temperature adhesive property. More specifically, when they have high heat resistance, adhesion must be conducted at a temperature higher than the conventional adhesives used in TAB tapes. In such a case, problems such as deterioration of dimensional stability to heat history, curing of a tape for TAB, strength reduction of a copper foil and reduction in the productivity of TAB tapes have arisen. On the other hand, the preparation for use of a polyimide resin which permits adhesion at a low temperature has involved such problems that the heat resistance is insufficient, its properties upon melting become unsuitable for the fornation of an adhesive layer, it exhibits uneven adhesive property to become unsuitable for fining, and reduction in the productivity of TAB tapes is caused.

It is therefore an object of the present invention to provide an adhesive for electronic parts, which satisfies both of heat resistance and formability of the adhesive layer, and of low-temperature adhesive property, and an adhesive tape for electronic parts making use of such an adhesive.

In view of the-above-described problems, the present inventors have carried out repeated investigations as to adhesives which are improved in low-temperature adhesive property and can solve the above-described problems such as dimensional stability while possessing properties suitable for the fining, such as good heat resistance and stable adhesive property. As a result, it has been found that when at least two specific polyimide resins different in glass transition temperature (Tg) from each other and an epoxy resin are used, an adhesive which can achieve the above object can be provided, thus leading to completion of the present invention.

According to the present invention, there is thus provided an adhesive for electronic parts, comprising, as a resin component, two polyimide resins different in Tg by at least 20° C. from each other, and an epoxy resin, wherein at least one of the two polyimide resins is a reactive polyimide having structural units represented by the following formula (I), structural units represented by the following formula (II) and structural units represented by the following formula (III), and the other is a polyimide having structural units represented by the following formula (I) and structural units represented by the following formula (II), and the reactive polyimide and the epoxy resin are contained in ranges of at least 25 parts by weight and 10 to 100 parts by weight, respectively, per 100 parts by weight of the whole polyimide resin, (I)

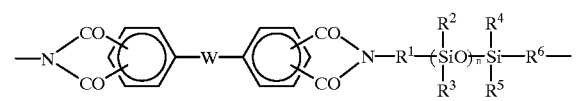

-continued

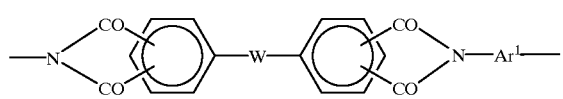

(II)

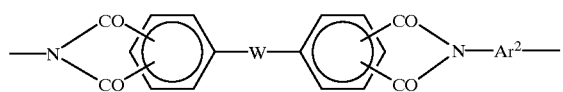

(III)

wherein W means a single bond, an alkylene group having 1 to 4 carbon atoms, —O—, —SO$_2$— or —CO—, Ar$^1$ denotes a divalent aromatic group represented by the following formula (1) or (2):

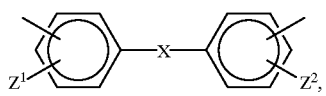

(1)

(2)

in which X is a single bond, an alkylene group having 1 to 4 carbon atoms, —O—, —SO$_2$— or —CO—, Y is an alkylene group having 1 to 4 carbon atoms, and Z$^1$ and Z$^2$ are each a hydrogen atom, a halogen atom, an alkyl group having 1 to 4 carbon atoms or an alkoxy group having 1 to 4 carbon atoms, Ar$^2$ represents a divalent aromatic group having one or two hydroxyl groups or carboxyl groups, preferably, a divalent aromatic group represented by the following formula (4) or (5):

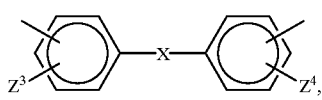

(4)

(5)

in which X and Y have the same meanings as defined above, and Z$^3$ and Z$^4$ are both hydroxyl groups or carboxyl groups, or one of them is a hydroxyl group or carboxyl group and the other is a hydrogen atom, R$^1$ and R$^6$ individually mean an alkylene group having 1 to 4 carbon atoms or a group represented by the following formula (3):

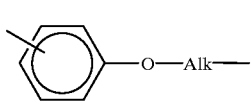

(3)

in which Alk is an alkylene group bonded to a silicon atom and having 1 to 4 carbon atoms, R$^2$ to R$^5$ individually denote an alkylene group having 1 to 4 carbon atoms, and n stands for an integer of 1 to 32.

In the adhesive for electronic parts according to the present invention, the epoxy resin may preferably be a trihydroxyphenylmethane type epoxy resin. The adhesive for electronic parts according to the present invention may further comprise a novolak type phenol resin or a bismaleimide resin.

According to the present invention, there is also provided an adhesive tape for electronic parts, comprising a substrate and an adhesive layer formed on at least one side of the substrate using the adhesive for electronic parts described above.

DETAILED DESCRIPTION OF PREFERRED EMBODIMENTS

The polyimide resins used in the adhesives for electronic parts according to the present invention will be first described. At least one of the two polyimide resins is a reactive polyimide having a functional group (hereinafter referred to as the "epoxy-reacting group") which reacts with an epoxy group and can be obtained by polycondensing a tetracarboxylic acid dianhydride represented by the following formula (IV) with a siloxane compound represented by the following formula (V), a diamine compound represented by the following formula (VI) and a diamine compound having an epoxy-reacting group represented by the following formula (VII) in an organic solvent, and imidating the resultant polyamic acid by ring closure. The other one can be obtained by polycondensing a tetracarboxylic acid dianhydride represented by the following formula (IV) with a siloxane compound represented by the following formula (V) and a diamine compound represented by the following formula (VI) in an organic solvent in the same manner as described above, and imidating the resultant polyamic acid by ring closure.

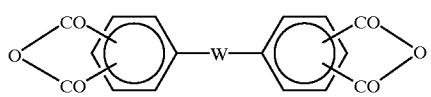

(IV)

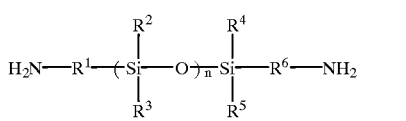

(V)

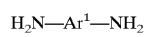

(VI)

(VII)

wherein W, Ar$^1$, Ar$^2$, R$^1$ to R$^6$ and n have the same meanings as defined above.

Examples of the tetracarboxylic acid dianhydride represented by the formula (IV) include 2,3,3',4'-biphenyltetracarboxylic acid dianhydride, 3,4,3',4'-biphenyltetracarboxylic acid dianhydride, 2,3,2',3'-biphenyltetracarboxylic acid dianhydride, bis(3,4-dicarboxyphenyl)methane dianhydride, bis(3,4-dicarboxyphenyl)ether dianhydride, bis(3,4-dicarboxyphenyl)sulfone dianhydride, 2,2-bis(3,4-dicarboxyphenyl)propane dianhydride, 3,4,3',4'-benzophenone tetracarboxylic acid dianhydride and 4',4'-biphthalic acid dianhydride.

Examples of the siloxane compound having amino groups at both terminals thereof represented by the formula (V) include 1,3-bis(3-aminoptopyl)-1,1,3,3- tetramethyldisiloxane, α,ω-bis(3-aminopropyl) polydimethylsiloxanes (for example, tetramer to octamer of aminopropyl-terminated dimethylsiloxane, etc.), 1,3-bis(3-aminophenoxymethyl)-1,1,3,3-tetramethyldisiloxane, α,ω-bis(3-aminophenoxymethyl)polydimethylsiloxane, 1,3-bis (2-(3-aminophenoxy)ethyl)-1,1,3,3-tetramethyldisiloxane, α,ω-bis(2-(3-aminophenoxy)ethyl)polydimethylsiloxane, 1,3-bis(3-(3-aminophenoxy)propyl)-1,1,3,3-tetramethyldisiloxane and α,ω-bis(3-(3-aminophenoxy)propyl)polydimethylsiloxane. In the above-mentioned siloxane compounds, those having an average polymerization degree of 1 to 32, preferably 1 to 16 and more preferably 4 to 8 are used in the case of the polysiloxanes.

Examples of the diamine compound represented by the formula (VI) include 3,4'-diaminodiphenyl ether, 4,4'-diaminodiphenyl ether, 3,3'-dimethyl-4,4'-diaminodiphenyl ether, 3,3'-diaminodiphenyl ether, 4,4'-diaminobenzophenone, 3,3'-diethyl-4,4'-diaminobenzophenone, 3,3'-diaminodiphenylmethane, 3,3'-dimethoxy-4,4'-diaminodiphenylmethane, 2,2'-bis(3-aminophenyl)propane, 4,4'-diaminodiphenyl sulfone, 3,3'-diaminodiphenyl sulfone, benzidine, 3,3'-dimethylbenzidine, 3,3'-dimethoxybenzidine, 3,3'-diaminobiphenyl, 1,3-bis(3-aminophenoxy)benzene, 2,2-bis[4-(4-aminophenoxy)phenyl]propane, 2,2-bis[3-methyl-4-(4-aminophenoxy)phenyl]propane, 2,2-bis[3-chloro-4-(4-aminophenoxy)phenyl]propane, 2,2-bis[3,5-dimethyl-4-(4-aminophenoxy)phenyl]propane, 1,1-bis[4-(4-aminophenoxy)phenyl]ethane, 1,1-bis[3-chloro-4-(4-aminophenoxy)phenyl]ethane, bis[4-(4-aminophenoxy) phenyl]methane, bis[3-methyl-4-(4-aminophenoxy)phenyl] methane, 4,4'-[1,4-phenylenebis(1-methylethylidene)] bisaniline, 4,4'-[1,3-phenylenebis(1-methylethylidene)] bisaniline and 4,4'-[1,4-phenylenebis(1-methylethylidene)] bis(2,6-dimethylaniline). Two or more of these diamine compounds may be used in combination.

Examples of the diamine compound having an epoxy-reacting group represented by the formula (VII) include 2,5-dihydroxy-p-phenylenediamine, 3,3'-dihydroxy-4,4'-diaminodiphenyl ether, 4,3'-dihydroxy-3,4'-diaminodiphenyl ether, 3,3'-dihydroxy-4,4'-diaminobenzophenone, 3,3'-dihydroxy-4,4'-diaminodiphenylmethane, 3,3'-dihydroxy-4,4'-diaminodiphenyl sulfone, 4,4'-dihydroxy-3,3'-diaminodiphenyl sulfone, 2,2'-bis[3-hydroxy-4-(4-aminophenoxy)phenyl]propane, bis[3-hydroxy-4-(4-aminophenoxy)phenyl]methane, 3,3'-dicarboxy-4,4'-diaminodiphenyl ether, 4,3'-dicarboxy-3,4'-diaminodiphenyl ether, 3,3'-dicarboxy-4,4'-diaminobenzophenone, 3,3'-dicarboxy-4,4'-diaminodiphenylmethane, 3,3'-dicarboxy-4,4'-diaminodiphenyl sulfone, 4,4'-dicarboxy-3,3'-diaminodiphenyl sulfone, 3,3'-dicarboxybenzidine, 2,2'-bis [3-carboxy-4-(4-aminophenoxy)phenyl]propane and bis[3-carboxy-4-(4-aminophenoxy)phenyl]methane. Two or more of these diamine compounds may be used in combination.

In order to obtain the polyimide resin according to the present invention, one of the above-mentioned tetracarboxylic acid dianhydride is allowed to react with the siloxane compound having amino groups at both terminals thereof and the diamine compounds at −20 to 150° C., preferably 0 to 60° C. for several tens minutes to several days in the presence of a solvent to form a polyamic acid, and the resultant polyamic acid is further imidated, whereby the polyamide resin can be prepared. Examples of the solvent include amide solvents such as N,N-dimethylformamide, N,N-dimethylacetamide, N,N-diethylacetamide, N-methyl-2-pyrrolidone; sulfur-containing solvents such as dimethyl sulfoxide and dimethyl sulfone; phenolic solvents such as phenol, cresol and xylenol; and acetone, tetrahydrofuran, pyridine, tetramethylurea, etc.

Methods for the imidation include a method comprising cyclizing the polyamic acid by dehydration with heat and a method comprising chemically cyclizing the polyamic acid by using a cyclization-dehydration catalyst. When the polyamic acid is cyclized by dehydration with heat, the reaction temperature is 150 to 400° C., preferably 180 to 350° C., and the reaction time is several tens minutes to several days, preferably 2 to 12 hours. Examples of the cyclization-dehydration catalyst in the case of the chemical cyclization include anhydrides of acids such as acetic acid, propionic acid, butyric acid and benzoic acid. It is preferable to use pyridine or the like for promoting the ring-closure reaction. The amount of the catalyst used is at least 200 mol %, preferably 300 to 1,000 mol % based on the total amount of the diamines.

In the reactive polyimide used in the present invention, the structural units represented by the formula (I) and the structural units represented by the formulae (II) and (III) are preferably arranged at a molar ratio of 5/95 to 50/50. A proportion of the structural units represented by formula (II) to the structural units represented by the formulae (III) is in a range of 0:100 to 99:1, preferably 80:20 to 95:5, more preferably 50:50 to 95:5 in terms of a molar ratio. The number average molecular weight of the reactive polyimide is preferably in a range of 5,000 to 40,000. In the case of the polyimide having no epoxy-reacting group, the structural units represented by the formula (I) and the structural units represented by the formula (II) are preferably arranged at a molar ratio of 5/95 to 50/50. The number average molecular weight thereof is preferably in a range of 5,000 to 40,000. If the number average molecular weight of each of the above-described polyimides is lower than 5,000, the film-forming property of the resulting adhesive is impaired. On the other hand, any molecular weight higher than 40,000 results in an adhesive deteriorated in solubility in solvents and having poor processability. It is hence preferred that the molecular weight be within the above range. Incidentally, the number average molecular weight is a value determined by using tetrahydrofuran as an eluent, Shodex 80M (2 columns, product of Showa Denko K.K.) as a column and polystyrene as a standard reference substance in accordance with the GPC method.

In the adhesives for electronic parts according to the present invention, at least one of the two polyimide resins must be a reactive polyimide having an epoxy-reacting group. In the present invention, these two polyimide resins must differ in Tg by at least 20° C. from each other. The difference in Tg is preferably 25 to 180° C. In this case, the Tg of either polyimide resin may be higher. The combined use of at least two polyimide resins different in Tg by at least 20° C. from each other permits easily adjusting the flexibility that is a feature of the siloxane-modified polyimide resin, so that no adverse influence is exerted on its properties upon melting while making it possible to lower the adhesion temperature. Therefore, an adhesive layer can be formed with ease. More specifically, the resultant adhesive begins to soften at a low temperature, undergoes no rapid change of viscosity and has excellent heat resistance. In addition, an effect that flexibility is imparted to a product cured by the epoxy resin is brought about. If the difference in Tg between these polyimide resins is smaller than 20° C., the resulting adhesive cannot satisfy the requirements on both heat resistance and the ability to form an adhesive layer, and low-temperature adhesive property. If the difference is greater than 180° C. on the other hand, compatibility of the polyimide resins with each other is deteriorated, so that phase separation or the like is caused, resulting in a failure to form an adhesive layer. The Tg was measured by means of a Reovibron (Model DDV-01/25 FP) manufactured by Orientex Co. The measurement was conducted by applying a synthetic wave of 110 Hz under conditions of a sample length of 5 cm, a sample width of 0.2 cm, a sample thickness of generally about 50 μm, a measuring temperature of 25 to 300° C. and a heating rate of 3° C./min, and the maximum value of tan δ was regarded as Tg.

The Tg of each polyimide resins may be optionally designed by changing the kinds of the above-described raw materials, i.e., the tetracarboxylic acid dianhydride, diamine compounds and siloxane compound, and the content of the siloxane units. In general, the Tg tends to lower as the content of the siloxane units increases.

The polyimide resins different in Tg from each other are preferably blended in such a proportion that one polyimide resin is contained in a range of 25 to 400 parts by weight per 100 parts by weight of the other polyimide resin. The reactive polyimide resin having an epoxy-reacting group must be contained in a proportion of at least 25 parts by weight per 100 parts by weight of the whole polyimide resin, with the inclusion in a range of 25 to 75 parts by weight being preferred. If the content thereof is lower than 25 parts by weight, a problem that the heat resistance of the resulting adhesive is deteriorated arises.

In the adhesives according to the present invention, the total content of the polyimide resins must be at least 30 wt. % based on the whole resin component. If the total content of the polyimide resins is lower than 30 wt. %, the flexibility of the resulting adhesive is impaired, and such problems that its adhesive property to organic films and the like is deteriorated arise.

As the epoxy resin which is another main component of the adhesives for electronic parts according to the present invention, any epoxy resin may be used so far as it is publicly known. Examples thereof include bisphenol A type epoxy resins, bisphenol F type epoxy resins, phenol novolak type epoxy resins, glycidyl ether type epoxy resins, glycidyl ester type epoxy resins and glycidylamine type epoxy resins. Trihydroxy-phenylmethane type epoxy resins are particularly preferred. A blending proportion of the epoxy resin is in a range of 10 to 100 parts by weight, preferably 30 to 70 parts by weight per 100 parts by weight of the whole polyimide resin. If the blending proportion of the epoxy resin is lower than 10 parts by weight, the heat resistance of the resulting adhesive cannot be improved. If the proportion exceeds 100 parts by weight on the other hand, the flexibility as the resin is lost.

The adhesives for electronic parts according to the present invention may comprise, if desired, a novolak type phenol resin. Any known resin may be used as the novolak type phenol resin, and bisphenol A type novolak phenol resins and alkylphenol type novolak phenol resins are preferably used. A preferable amount of the novolak type phenol resin used is in a range of 80 parts by weight or less, preferably 10 to 80 parts by weight, more preferably 20 to 70 parts by weight per 100 parts by weight of the whole polyimide resin.

The adhesives for electronic parts according to the present invention may preferably comprise further a maleimide resin. Preferable examples of usable maleimide resins include bismaleimide resins having 2 maleimide groups. Examples of bismaleimides include N,N'-m-phenylenebismaleimide, N,N'-toluylenebismaleimide, N,N'-4,4'-biphenylenebismaleimide, N,N'-(3,3-dimethylphenylmethane)bismaleimide, N,N'-4,4'-dimethylphenylpropanebismaleimide, N,N'-4,4'-dimethylphenyl ether bismaleimide and N,N'-3,3'-dimethylphenyl sulfone bismaleimide. A blending proportion of the maleimide resin is in a range of 50 parts by weight or lower, preferably 1 to 50 parts by weight, more preferably 5 to 30 parts by weight per 100 parts by weight of the whole polyimide resin.

The adhesives for electronic parts according to the present invention may comprise, if desired, a hardener and a hardening accelerator for epoxy resins. Examples thereof include imidazoles, tertiary amines, phenols, dicyandiamides, aromatic diamines and organic peroxides. Organic and/or inorganic fillers may also be contained. With respect to the organic and/or inorganic fillers, for example, alumina, silicon nitride, boron nitride and the like may be contained for the purpose of imparting insulating property and thermal conductivity to the resulting adhesive, powder of metals such as silver, copper and nickel for the purpose of imparting thermal conductivity to the resulting adhesive, and titanium oxide, calcium carbonate, silica, zinc oxide, magnesium oxide and the like for the purpose of adjusting the dielectric properties, coefficient of thermal expansion, viscoelasticity and tackiness of the resulting adhesive. A preferable content thereof is in a range of 1 to 70 wt. %, preferably 5 to 50 wt. % based on the total solid content of the adhesive.

The adhesive tapes for electronic parts according to the present invention have an adhesive layer formed with one of the above-described adhesives on at least one side of a substrate. Preferable examples of the substrate include releasable films, heat-resistant insulating films, paper sheets the surfaces of which have been subjected to a releasing treatment, metal foils and metal sheets, with heat-resistant insulating films being particularly preferred. Specific examples thereof include films of synthetic resins such as polyethylene, polypropylene, fluorocarbon resins, polyimide and polyethylene terephthalate. Those having a thickness ranging from 10 to 300 μm are preferably used. Examples of the metal foils and metal sheets include those formed of copper, cupronickel, silver, iron, 42 alloy or stainless steel. Those having a thickness ranging from 10 to 1,000 μm are preferably used.

In the formation of the adhesive layer, may be adopted a method in which one of the above-described adhesives for electronic parts is coated on a surface of the substrate, a method in which the adhesive is injection-molded into a film, and the film is then laminated on the substrate, or the like. In the case where the adhesive layer is formed by coating, it is only necessary to form an adhesive layer by using an adhesive solution obtained by dissolving the resin components in, for example, a polar solvent to apply it by any known method. If desired, the adhesive layer formed may be heated into a semi-cured state of the B-stage. A thickness of the adhesive layer is preferably in a range of 5 to 100 μm, more preferably 10 to 50 μm.

In the adhesive tapes for electronic parts according to the present invention, a protective film may be stuck on the surface of the adhesive layer as needed. As the protective film, is used a paper sheet treated with a releasing agent, or a film of a synthetic resin such as polyethylene, polypropylene or polyethylene terephthalate.

In the case where the substrate is a releasable film or a paper sheet the surface of which has been subjected to a releasing treatment, such a substrate may be peeled off from the adhesive layer upon use, and only the adhesive layer is used as an adhesive tape.

The adhesives for electronic parts according to the present invention have the above-described features. Therefore, when such an adhesive is coated on a substrate to form an adhesive layer, the adhesive layer has sufficient flexibility, exhibits uniform low-temperature adhesive property and moreover has sufficient flexibility and excellent heat resistance and dimensional stability to heat history even after the adhesive layer is cured by heating. Accordingly, the adhesives for electronic parts according to the present invention are suitable for use as adhesives for laminating materials of which flexibility is required, such as flexible wiring substrates and copper-clad substrates for TAB and provide excellent TAB tapes in particular.

EXAMPLES

Synthesis Example 1
<Polyimide Having No Epoxy-reacting Group (Polyimide Resin A)>

A flask equipped with a stirrer was charged with 10.33 g (52 mmol) of 3,4'-diaminodiphenyl ether, 18.23 g (48 mmol) of 1,3-bis(3-aminophenoxymethyl)-1,1,3,3-tetramethyldisiloxane, 32.22 g (100 mmol) of 3,4,3',4'-benzophenonetetracarboxylic acid dianhydride and 300 ml of N-methyl-2-pyrrolidone (NMP) under ice cooling, and the mixture was stirred for 1 hour. The resultant solution was then allowed to react at room temperature for 3 hours in a nitrogen atmosphere to synthesize a polyamic acid. To a solution of the thus-obtained polyamic acid were added 50 ml of toluene and 1.0 g p-toluenesulfonic acid, and the resultant mixture was heated to 160° C. While separating water from an azeotrope with toluene, imidation was conducted for 3 hours. Toluene was distilled off from the reaction mixture, and the resultant polyimide varnish was poured into methanol. Precipitate thus obtained was separated, ground, washed and dried, thereby obtaining 54.3 g (yield: 95%) of a polyimide. An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

Synthesis Example 2
<Reactive Polyimide (Polyimide Resin a)>

A reactive polyimide (62.5 g; yield: 93%) was obtained in accordance with a process similar to that in Synthesis Example 1 using 16.10 g (39 mmol) of 2,2-bis[4-(4-aminophenoxy)phenyl]propane, 1.25 g (5 mmol) of 3,3'-dicarboxy-4,4'-diaminodiphenylmethane, 21.25 g (56 mmol) of 1,3-bis(3-aminophenoxymethyl)-1,1,3,3-tetramethyldisiloxane, 32.22 g (100 mmol) of 3,4,3',4'-benzophenonetetracarboxylic acid dianhydride and 300 ml of N-methyl-2-pyrrolidone (NMP). An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

Synthesis Example 3
<Polyimide Having No Epoxy-reacting Group (Polyimide Resin B)>

A polyimide (67.4 g; yield: 92%) was obtained in accordance with a process similar to that in Synthesis Example 1 using 33.65 g (82 mmol) of 2,2-bis[4-(4-aminophenoxy)phenyl]propane, 13.84 g (18 mmol) of an octamer of aminopropyl-terminated dimethylsiloxane, 29.42 g (100 mmol) of 2,3,3',4'-biphenyltetracarboxylic acid dianhydride and 300 ml of N-methyl-2-pyrrolidone. An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

Synthesis Example 4
<Reactive Polyimide (Polyimide Resin b)>

A reactive polyimide (67.8 g; yield: 94%) was obtained in accordance with a process similar to that in Synthesis Example 1 using 30.38 g (74 mmol) of 2,2-bis[4-(4-aminophenoxy)phenyl]propane, 2.35 g (8 mmol) of 3,3'-dicarboxy-4,4'-diaminodiphenylmethane, 13.84 g (18 mmol) of an octamer of aminopropyl-terminated dimethylsiloxane, 29.42 g (100 mmol) of 2,3,3',4'-biphenyltetracarboxylic acid dianhydride and 300 ml of N-methyl-2-pyrrolidone. An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

Synthesis Example 5
<Polyimide Having No Epoxy-reacting Group (Polyimide Resin C)>

A polyimide (78.7 g; yield: 97%) was obtained in accordance with a process similar to that in Synthesis Example 1 using 31.98 g (78 mmol) of 2,2-bis[4-(4-aminophenoxy)phenyl]propane, 16.95 g (22 mmol) of an octamer of aminopropyl-terminated dimethylsiloxane, 35.83 g (100 mmol) of bis(3,4-dicarboxyphenyl) sulfone dianhydride and 300 ml of N-methyl-2-pyrrolidone. An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

Synthesis Example 6
<Reactive Polyimide (Polyimide Resin c)>

A reactive polyimide (75.0 g; yield: 93%) was obtained in accordance with a process similar to that in Synthesis Example 1 using 30.38 g (74 mmol) of 2,2-bis[4-(4-aminophenoxy)phenyl]propane, 1.12 g (4 mmol) of 3,3'-dicarboxy-4,4'-diaminodiphenylmethane, 16.85 g (22 mmol) of an octamer of aminopropyl-terminated dimethylsiloxane, 35.83 g (100 mmol) of bis(3,4-dicarboxyphenyl) sulfone dianhydride and 300 ml of N-methyl-2-pyrrolidone. An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

Synthesis Example 7
<Polyimide Having No Epoxy-reacting Group (Polyimide Resin D)>

A polyimide (47.1 g; yield: 93%) was obtained in accordance with a process similar to that in Synthesis Example 1 using 26.13 g (89 mmol) of 1,3-bis(3-aminophenoxy) benzene, 8.14 g (11 mmol) of an octamer of aminopropyl-terminated dimethylsiloxane, 20.02 g (100 mmol) of bis(3, 4-dicarboxyphenyl) ether dianhydride and 300 ml of N-methyl-2-pyrrolidone. An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

Synthesis Example 8
<Reactive Polyimide (Polyimide Resin d)>

A reactive polyimide (45.6 g; yield: 91%) was obtained in accordance with a process similar to that in Synthesis Example 1 using 23.55 g (81 mmol) of 1,3-bis(3-aminophenoxy)benzene, 2.06 g (9 mmol) of 3,3'-dihydroxy-4,4'-diaminodiphenylmethane, 8.05 g (10 mmol) of an octamer of aminopropyl-terminated dimethylsiloxane, 20.02 g (100 mmol) of bis(3,4-dicarboxyphenyl)ether dianhydride and 300 ml of N-methyl-2-pyrrolidone. An infrared absorption spectrum of this polyimide was determined. As a result, typical absorption attributable to imide was observed at 1718 cm$^{-1}$ and 1783 cm$^{-1}$. The molecular weight, glass transition temperature and thermal decomposition-starting temperature thereof were also determined. The results thereof are shown in Table 1.

TABLE 1

| Polyimide | Epoxy-reacting group | Number average molecular weight | Glass transition temperature (° C.) | Thermal decomposition-starting temperature (° C.) |
|---|---|---|---|---|
| Syn. Ex. 1 | Not contained | 27000 | 185 | 420 |
| Syn. Ex. 2 | Contained | 18000 | 160 | 421 |
| Syn. Ex. 3 | Not contained | 28000 | 80 | 425 |
| Syn. Ex. 4 | Contained | 25000 | 80 | 425 |
| Syn. Ex. 5 | Not contained | 22000 | 50 | 421 |
| Syn. Ex. 6 | Contained | 21000 | 50 | 420 |
| Syn. Ex. 7 | Not contained | 17000 | 100 | 430 |
| Syn. Ex. 8 | Contained | 16000 | 105 | 425 |

Example 1

In tetrahydrofuran (hereinafter referred to as "THF") were dissolved 25 parts by weight of Polyimide Resin A, 25 parts by weight of Reactive Polyimide Resin a, 20 parts by weight of a trihydroxy-methane type epoxy resin (Epikote 1032, trade name; product of Yuka Shell Epoxy K.K.), 20 parts by weight of p-tert-butyl type phenol resin (CKM2432, trade name; product of Showa Highpolymer Co., Ltd.), a bismaleimide resin (BMI-MP, trade name; product of Mitsui Chemicals, Inc.) and 0.1 part by weight of 2-ethyl-4-methylimidazole, thereby preparing an adhesive of 40 wt. % resin solid concentration.

Example 2

An adhesive was prepared in the same manner as in Example 1 except that the amounts of Polyimide Resin A and Reactive Polyimide Resin a were changed from 25 parts by weight and 25 parts by weight to 40 parts by weight and 10 parts by weight, respectively.

Example 3

An adhesive was prepared in the same manner as in Example 1 except that Polyimide Resin A was changed to Reactive Polyimide Resin b.

Example 4

An adhesive was prepared in the same manner as in Example 1 except that Polyimide Resin A and Reactive Polyimide Resin a were changed to Polyimide Resin B and Reactive Polyimide Resin d, respectively.

Comparative Example 1

An adhesive was prepared in the same manner as in Example 1 except that Reactive Polyimide Resin a alone was used in an amount of 50 parts by weight as a polyimide resin.

Comparative Example 2

An adhesive was prepared in the same manner as in Example 1 except that Polyimide Resin A alone was used in an amount of 50 parts by weight as a polyimide resin.

Comparative Example 3

An adhesive was prepared in the same manner as in Example 1 except that Polyimide Resin A and Reactive Polyimide Resin a were changed to Polyimide Resin C and Reactive Polyimide Resin c, respectively.

(Comparative Evaluation Tests and Results Thereof)

Each of the adhesives prepared in accordance with the respective processes was applied to a polyester film having a thickness of 38 μm and dried at 100° C. for 5 minutes to produce a laminate film having an adhesive layer 25 μm thick.

A hole of 1 cm×1 cm was made in the resultant laminate film by perforating, and the film was superimposed on a copper foil (3EC-VLP foil, product of Mitsui Mining & Smelting Co., Ltd.; thickness: 25 μm) in such a manner that the adhesive layer faces a roughened surface of the copper foil, thereby laminating them by a laminator composed of rubber rolls under conditions of a rate of 1 m/min and a linear pressure of 1 kg/cm. The thus-obtained laminate film was investigated as to the degree of embedding of the adhesive in the roughened surface of the copper foil and runout of the adhesive from the hole. The results thereof are shown in Table 2.

TABLE 2

| | Difference in Tg (° C.) | Proper range of laminating temperature | | Rate of change in shape by hot pressing | |
|---|---|---|---|---|---|
| | | (° C.) | Practicability | (%) | Practicability |
| Ex. 1 | 25 | 145–170 | Practicable | 2 | Practicable |
| Ex. 2 | 25 | 160–180 | Practicable | 4 | Practicable |
| Ex. 3 | 80 | 105–140 | Practicable | 2 | Practicable |
| Ex. 4 | 25 | 90–130 | Practicable | 6 | Practicable |
| Comp. Ex. 1 | 0 | 170 | Unpracticable | 8 | Practicable |
| Comp. Ex. 2 | 0 | 170–175 | Unpracticable | 20 | Unpracticable |
| Comp. Ex. 3 | 0 | 70–75 | Unpracticable | 10 | Practicable |

The embedding ability was visually judged. With respect to the runout, a degree of runout of the adhesive at the greatest runout part about each side of the hole was determined through an optical reflection microscope of 100 magnifications, and the maximum value among the degrees of runout about 4 sides was regarded as the degree of runout. More specifically, in the above-described procedure, the laminating temperature was raised 5° C. by 5° C. to determine the embedding ability in the copper foil and the degree of runout of the adhesive at the respective temperatures. Since the level of runout allowable for practical use is 100 μm, laminating temperatures at which the embedding was sufficient, and the degree of runout was at most 100 μm were evaluated as a proper range of laminating temperature. The proper range of laminating temperature must extend over 20° C. at the minimum in view of the margin of process for practical use. In the cases of Comparative Examples 1 to 3, however, the proper range of laminating temperature is narrow as shown in Table 2, so that such adhesives were unable to be put to practical use.

When the adhesives are used for TAB tapes, an IC chip is often wire-bonded to a circuit pattern formed on a TAB tape. Therefore, with respect to properties at that time, the resistance to heat and pressure at a high temperature of each adhesive was evaluated as an alternate property. The evaluation method is as follows. The polyester film of each of the above laminate films was removed, and the adhesive alone was heated and cured to prepare a cured adhesive film. This adhesive film was cut into 1-cm², and a cut piece was hot-pressed at 200° C. for 30 seconds under a pressure of 100 kg/cm² by a hot press. The area of the cut piece after the hot pressing was measured to determine a rate of change in shape in accordance with the following equation:

Rate of change in shape (%)=100×(area after hot pressing−1)

When the rate of change in shape was 10% or lower, such an adhesive was ranked as one having excellent resistance to heat and pressure and capable of being subjected to wire bonding. For example, when a capillary is brought into contact under pressure with a circuit pattern upon wire bonding, and an adhesive under the pattern undergoes softening or the like, bonding force is absorbed, resulting in a failure to fully bond wires to the circuit pattern. Therefore, it is necessary for the adhesive to have excellent resistance to heat and pressure. As shown in Table 2, the adhesives of Examples 1 to 4 each had excellent resistance to heat and pressure, but the adhesive of Comparative Example 2 had poor resistance to heat and pressure and was of no practical use because no reactive polyimide is used though the Tg of the polyimide resin is high.

As apparent from the results shown in Table 2, the adhesives of Examples 1 to 4 are wide in the proper range of laminating temperature and low in the rate of change in shape, and are hence excellent from the viewpoint of practical use. On the other hand, the adhesive of Comparative Example 1 is a pinpoint in the proper range of laminating temperature and has no practicability. The adhesive of Comparative Example 2 is narrow in the proper range of laminating temperature and high in the rate of change in shape, and hence has no practicability. The adhesive of Comparative Example 3 uses the polyimide resins having the same Tg. Therefore, it undergoes a rapid change of viscosity, is narrow in the proper range of laminating temperature and has no practicability.

What is claimed is:

1. An adhesive tape for electronic parts, which comprises a substrate and an adhesive layer formed on at least one side of the substrate, said adhesive comprising as a resin component, two polyimide resins different in glass transition temperature by at least 20° C. from each other, and an epoxy resin, wherein at least one of the two polyimide resins is a reactive polyimide having structural units represented by the following formula (I), structural units represented by the following formula (II) and structural units represented by the following formula (III), the other is a polyimide having structural units represented by the following formula (I) and structural units represented by the following formula (II), and the reactive polyimide and the epoxy resin are contained in ranges of at least 25 parts by weight and 10 to 100 parts by weight, respectively, per 100 parts by weight of the whole polyimide resin,

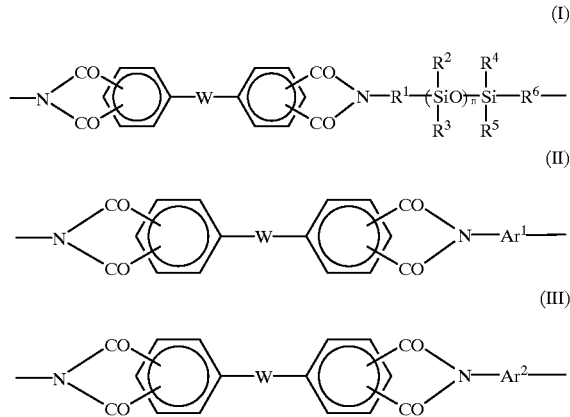

wherein W means a single bond, an alkylene group having 1 to 4 carbon atoms, —O—, SO$_2$—or COAr$^1$ denotes a divalent aromatic group represented by the following formula (1) or (2):

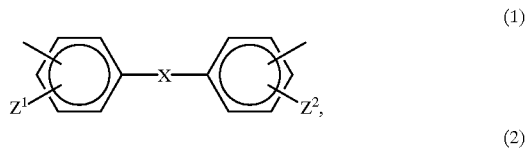

in which X is a single bond, an alkylene group having 1 to 4 carbon atoms, —O—, SO$_2$— or —CO—, Y is an alkylene group having 1 to 4 carbon atoms, and Z$^1$ and Z$^2$ are each a hydrogen atom, a halogen atom, an alkyl group having 1 to 4 carbon atoms or an alkoxy group having 1 to 4 carbon atoms, Ar$^2$ represents a divalent aromatic group having one or two hydroxyl groups or carboxyl groups, R$^1$ and R$^6$ individually mean an alkylene group having 1 to 4 carbon atoms or a group represented by the following formula (3):

in which Alk is an alkylene group bonded to the silicon atoms in the formula I and having 1 to 4 carbon atoms, R$^2$ to R$^5$ individually denote an alkylene group having 1 to 4 carbon atoms, and n stands for an integer of 1 to 32.

2. The adhesive tape according to claim 1, wherein in the reactive polyimide, a proportion of the structural units represented by the formula (I) to the structural units represented by the formulae (II) and (III) falls within a range of 5:95 to 50:50 in terms of a molar ratio, and a proportion of the structural units represented by the formula (II) to the structural units represented by the formula (III) falls within a range of 20:80 to 99:5 in terms of a molar ratio.

3. The adhesive tape according to claim 1, wherein in the polyimide having structural units represented by the formula (I) and structural units represented by the formula (II), said structural units being irregularly arranged, a proportion of the structural units represented by the formula (I) to the structural units represented by the formula (II) falls within a range of 5:95 to 50:50 in terms of a molar ratio.

4. The adhesive tape according to claim 1, wherein the epoxy resin is an epoxy resin having a trihydroxyphenyl-methane structure.

5. The adhesive tape according to claim 1, wherein the adhesive tape is for tape automated bonding.

* * * * *